(12) United States Patent
Drapkin et al.

(10) Patent No.: US 6,268,744 B1
(45) Date of Patent: Jul. 31, 2001

(54) THREE LEVEL PRE-BUFFER VOLTAGE LEVEL SHIFTING CIRCUIT AND METHOD

(75) Inventors: Oleg Drapkin, North York; Grigori Temkine, Toronto, both of (CA)

(73) Assignee: ATI International SRL, Barbados (KN)

( * ) Notice: Subject to any disclaimer, the term of this patent is extended or adjusted under 35 U.S.C. 154(b) by 0 days.

(21) Appl. No.: 09/609,022

(22) Filed: Jun. 30, 2000

Related U.S. Application Data

(63) Continuation of application No. 09/300,365, filed on Apr. 26, 1999, now Pat. No. 6,130,557.

(51) Int. Cl.[7] .............................................. H03K 19/0185
(52) U.S. Cl. .................. 326/81; 326/63; 326/83
(58) Field of Search .................. 326/83, 86, 80, 326/81, 59, 60, 63, 68–71

(56) References Cited

U.S. PATENT DOCUMENTS

| | | | |
|---|---|---|---|
| 5,510,731 | 4/1996 | Dingwall | 326/81 |
| 5,723,987 | 3/1998 | Ronen | 326/81 |
| 5,821,800 | 10/1998 | Le et al. | 326/81 |
| 5,966,030 | 10/1999 | Schmitt et al. | 326/81 |
| 6,064,227 | 5/2000 | Saito | 326/80 |
| 6,064,229 | 5/2000 | Morris | 326/81 |

Primary Examiner—Michael Tokar
Assistant Examiner—Don Phu Le
(74) Attorney, Agent, or Firm—Vedder, Price, Kaufman & Kammholz

(57) ABSTRACT

A buffer circuit utilizes a single gate oxide pre-buffer voltage level shifting circuit on, for example, an output buffer of an I/O pad, to accommodate different I/O pad supply voltages while maintaining normal operating voltages (degradation levels) across boundaries of single gate oxide devices that form the buffer. The single gate oxide output buffer can operate at several different supply voltages. A pre-buffer voltage level shifting circuit includes a multi-supply voltage level shifting circuit having signal gate oxide devices coupled to produce a pre-buffer output signal to an output buffer. A single gate oxide cross coupled active load is coupled to the multi-supply voltage level shifting circuit and provides suitable drive voltages to at least one of cascaded buffer transistors.

14 Claims, 5 Drawing Sheets

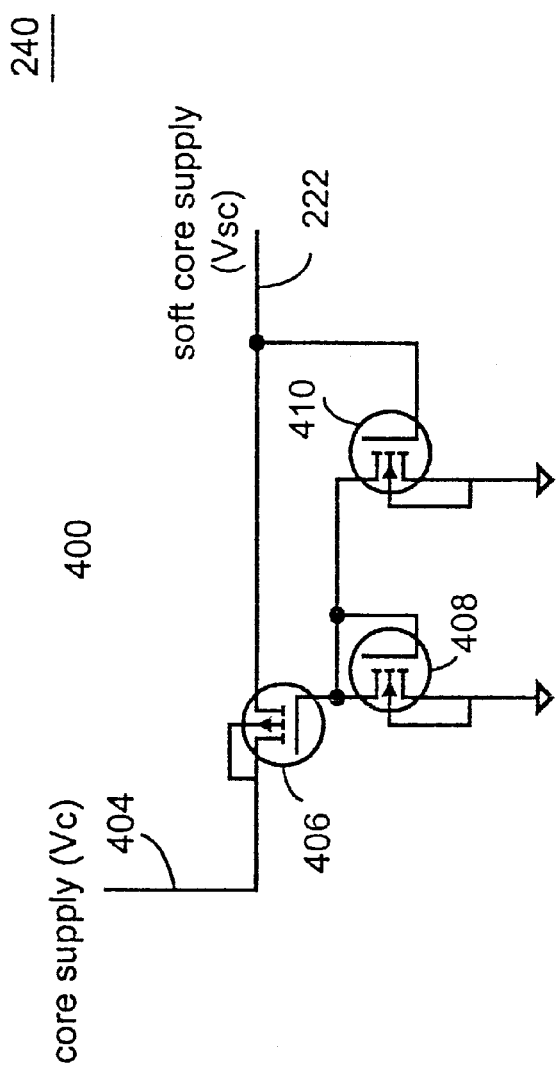
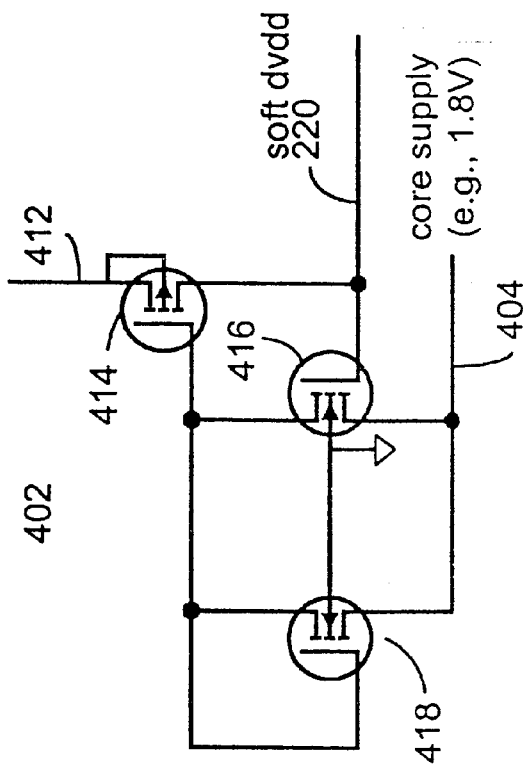
FIG. 4a
FIG. 4b

US 6,268,744 B1

THREE LEVEL PRE-BUFFER VOLTAGE LEVEL SHIFTING CIRCUIT AND METHOD

CROSS REFERENCE TO RELATED APPLICATION

This application is a continuation of application entitled "Three Level Pre-Buffer Voltage Level Shifting Circuit and Method," having inventors Drapkin et al., Ser. No. 09/300,365, filed on Apr. 26, 1999 now U.S. Pat. No. 6,130,557 and assigned to instant assignee.

RELATED CO-PENDING APPLICATION

This is a related application to co-pending application entitled "Pre-buffer Voltage Level Shifting Circuit and Method", having as inventor Oleg Drapkin et al., filed on Dec. 14, 1998, having Ser. No. 09/211,496, assigned to instant assignee and hereby incorporated by reference.

FIELD OF THE INVENTION

The invention relates generally to devices that may use a number of different voltage supply levels, and more particularly to systems and methods for allowing input/output buffers to suitably operate using different voltage supply levels.

BACKGROUND OF THE INVENTION

Graphics controller chips, like many integrated circuit devices, utilize CMOS, logic cores, and associated input/output (I/O) pads as part of their circuit makeup. I/O pads include, for example, input/output buffers coupled to a common pad or pin. There is a constant challenge to continuously design smaller, faster and more complicated integrated circuits to provide increased functionality for multimedia applications and other applications. Typically, the logic core operates at a different supply voltage than the I/O pads. For example, with logic cores having minimum gate lengths of 0.25 um and gate oxide thicknesses of 50 angstroms, a core logic supply voltage may be 2.5 volts. Corresponding supply voltages for the input/output pads, however, may be different supply voltages such as 3.3 volts. However, future generation chips require faster speeds and lower power consumption, hence, lower supply voltages so that the I/O pads can switch at faster frequencies.

Also, integrated circuits must often provide compatibility with older versions of interface circuits. As a result, an integrated circuit may require that the I/O pads operate at either a 3.3 volt level, or for example, at a lower 1.5 volt level. The gate length and gate oxide thickness of I/O pad transistors must also typically be decreased to provide faster circuits that draw less current. With multilevel supply voltages, multi-gate oxide thickness devices are often used to provide the requisite logic levels and overvoltage protection. However, a problem arises when multi-gate oxide transistors are used on the same chip. Using differing gate thickness' requires additional fabrication processes and, hence, results in higher fabrication costs. Moreover, the larger gate oxide thickness can slow the device down unnecessarily. For low voltage CMOS signaling, the input/output pad must also be designed to prevent static leakage and prevent damage due to gate-source or gate-drain overvoltage.

FIG. 1a shows a block diagram of a conventional I/O pad 10 including an output buffer 12 and an input buffer 14 coupled to a common pad or pin 16. The I/O pad 10 communicates signals to and from the pad 16 for the core logic 18. As shown in FIG. 1c, one known solution for preventing gate-source over voltage and reducing static leakage for an output buffer of an I/O pad is to use thick gate MOSFETS indicated as transistors 20a and 20b. As shown, pmos transistor 20a and nmos transistor 20b are configured as thick gate oxide devices having approximately a 70 angstrom gate oxide. The output buffer includes pre-buffers 22a and 22b which allow an output signal on the pad to be a logic "1" or a "0" depending upon which MOSFET is activated. As shown, the supply voltage to the buffer may be, for example, 3.3 volts or 1.5 volts. Hence, these configurations can accommodate different I/O pad supply voltages. However, a problem with the structure of FIG. 1b is that the thick gate oxide transistor has to become too large to accommodate a 1.5 volt supply voltage to provide enough current and speed. Increasing the size of the thick gate devices will then increase the parasitic capacitance and slow down the operation of the device. It is desirable to reduce the gate oxide thickness and gate length to speed up the operation and reduce power consumption. As such, FIG. 1c shows a conventional design that employs a thin gate nmos cascade arrangement using nmos transistors 24a and 24b in conjunction with a thick gate pmos transistor 20a. The structure of FIG. 1c utilizes the cascading of the thin gate nmos devices such as thin gate oxide devices to prevent over voltage degradation to each of the respective thin gate devices. Voltages should be within normal operating voltages across junctions. However, this requires the use of a thick gate pmos device resulting in the use of several different gate oxide thickness technologies on the same I/O pad. The use of differing gate oxide technologies on the same chip can result in increased fabrication costs.

Consequently, a need exists for an I/O pad that can accommodate multiple source voltages using single gate oxide devices. It would be desirable to have an input/output pad containing I/O buffers that can handle different supply voltages while also reducing the cost of fabrication and improve operational speed.

BRIEF DESCRIPTION OF THE DRAWINGS

FIGS. 4a and 4b are circuit diagram illustrating one embodiment of supply voltage isolation circuits in accordance with one embodiment of the invention.

DETAILED DESCRIPTION OF A PREFERRED EMBODIMENT OF THE INVENTION

Briefly, a buffer circuit utilizes a single gate oxide pre-buffer voltage level shifting circuit on, for example, an output buffer of an I/O pad to accommodate different I/O pad supply voltages while maintaining normal operating voltages (degradation levels) across boundaries of single gate oxide devices that form the buffer. As structured, the single gate oxide output buffer can operate at several different supply voltages. A pre-buffer voltage level shifting circuit includes a multi-supply voltage level shifting circuit having single gate oxide devices coupled to produce a pre-buffer output signal to an output buffer. A single gate oxide cross coupled active load is coupled to the multi-supply voltage level shifting circuit and provides suitable drive voltages to at least one of cascaded buffer transistors. It will be recognized that the term pre-buffer and buffer as used herein may be used interchangeably since a buffer may be defined to include the pre-buffer circuitry. The pre-buffer output signal has a level within normal gate voltage operating levels of the single gate oxide devices for each of the least a plurality of supply voltages.

In one embodiment, a single gate oxide buffer drive circuit is operatively coupled to the cross coupled active load and receives a buffer drive input signal from the active load and outputs a buffer drive output signal to provide an additional drive current for the output buffer when the output buffer is attempting to output a logic high level. The multi-supply voltage level shifting circuit generates, in one embodiment, a three level variable pre-buffer output signal. The multi-supply voltage level shifting circuit, in effect, shifts a data signal from core logic, or other source, to provide efficient and safe control of single oxide gate output buffer transistor devices, such as p-channel devices, to facilitate multi-supply voltage level shifting in response to the use of one of a plurality of different output buffer supply voltage levels.

The level shifting circuit converts, for example, a 0 volt data input signal into a 0 volt, 1 volt or 1.8 volt level depending on the voltage supply used. As such, the disclosed circuit and method allows for the supporting of safe control of single thin gate oxide devices for a multitude of buffer supply voltages.

Figure 1A:
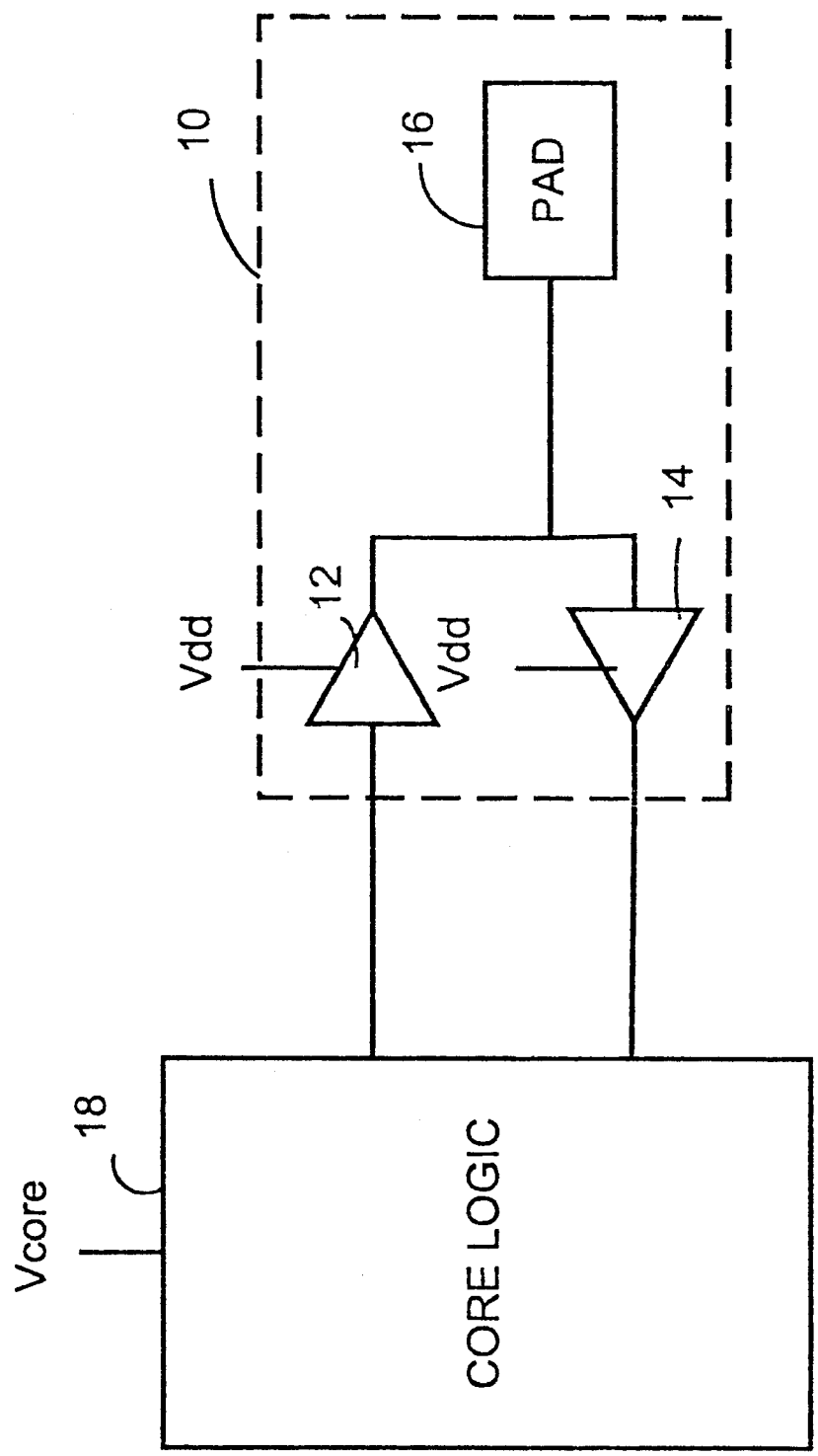
FIG. 1a is a block diagram of a prior art I/O pad and associated logic.
Figure 1C:
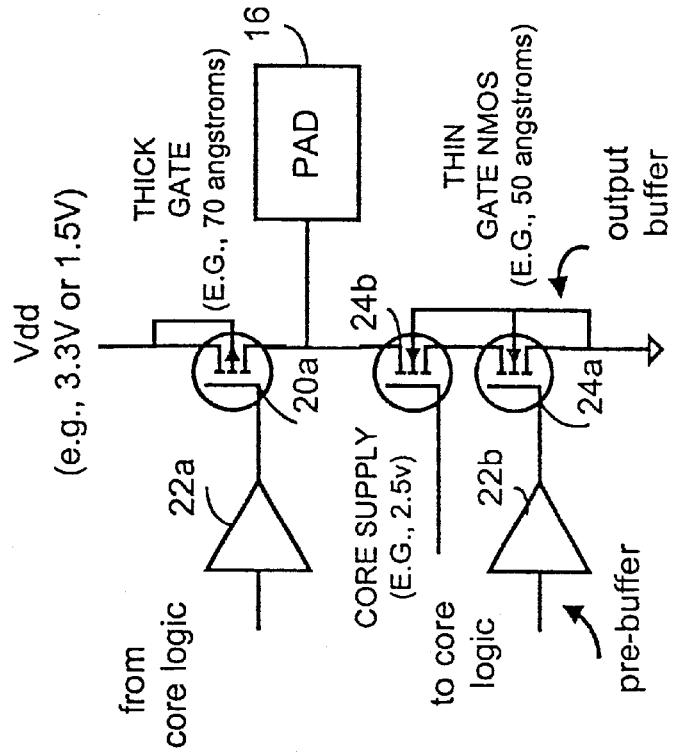
FIG. 1c illustrates a circuit diagram of another embodiment of prior art output buffer.
Figure 1B:
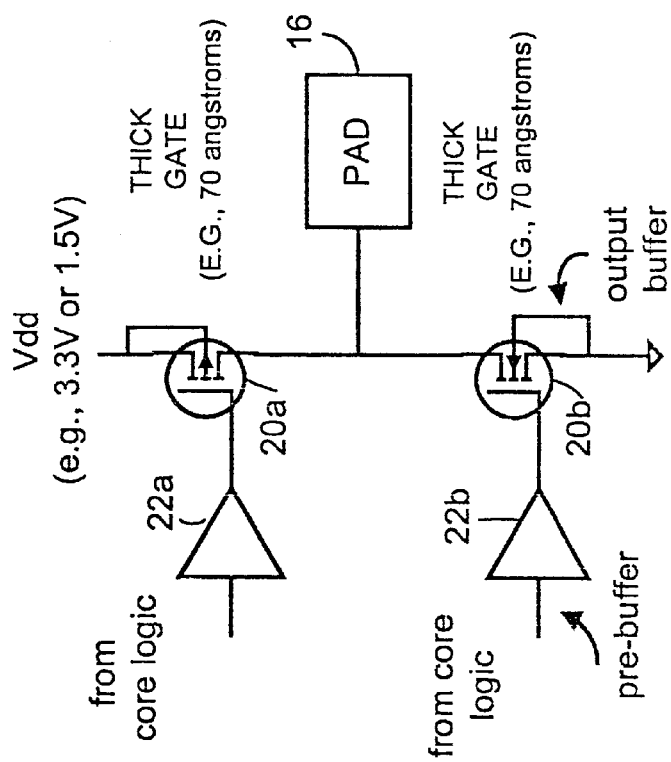
FIG. 1b is one example of a prior art output buffer.
Figure 2:
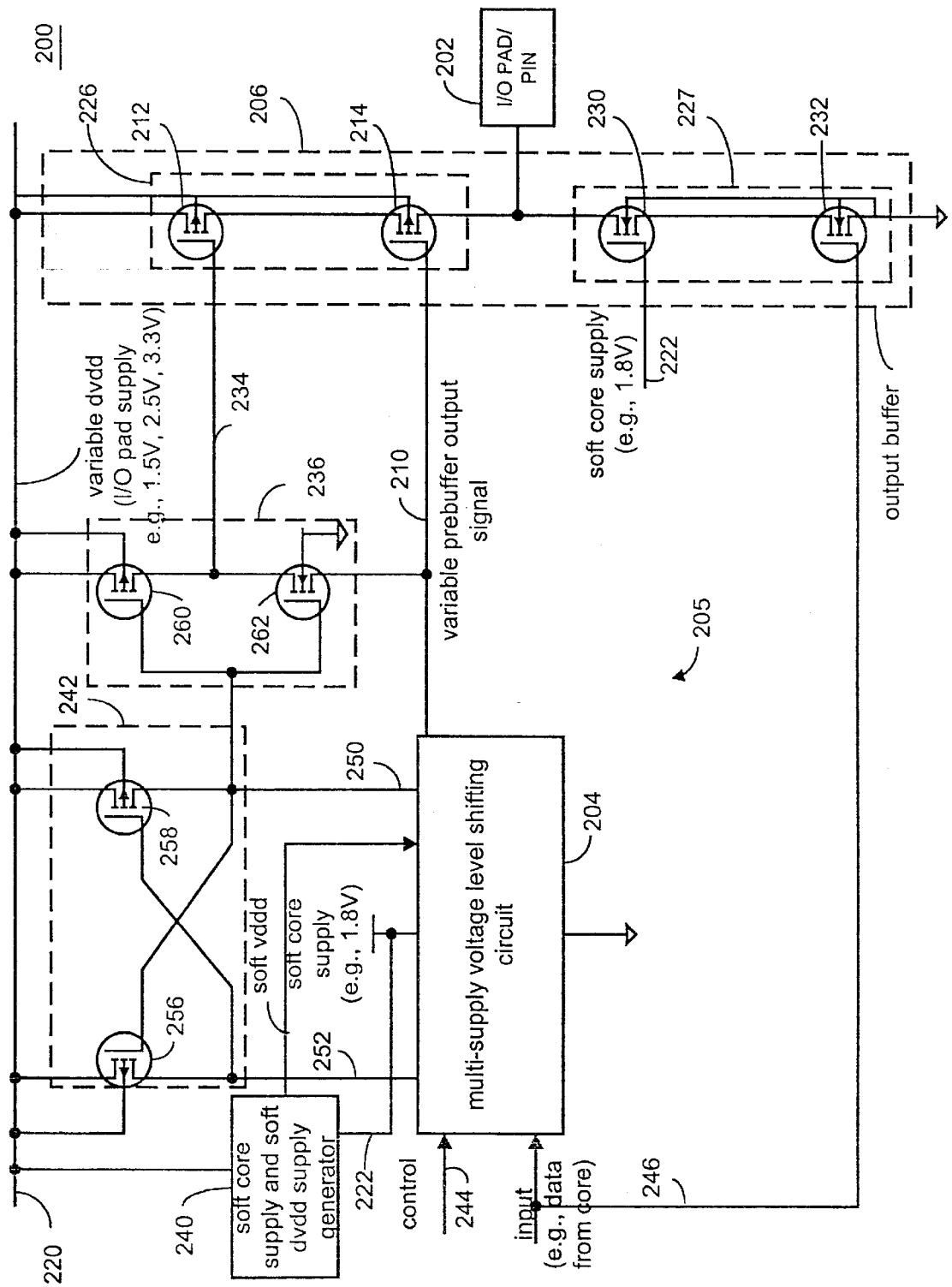
FIG. 2 illustrates a block diagram of one embodiment of the invention.

FIG. 2 shows one example of a buffer, such as an output buffer 200 coupled to a pad or pin 202. The output buffer 200 and pad 202 may be part of an I/O pad. The output buffer 200 includes a pre-buffer circuit 205 and output buffer circuit 206. The pre-buffer circuit 205 includes a multi-supply voltage level shifting circuit 204 having single gate oxide devices coupled to produce a variable pre-buffer output signal 210 to the output buffer 206. The variable pre-buffer output signal 210 has a level within normal operating voltage levels of the single gate oxide devices that make up the buffer, for each of at least three different buffer supply voltages.

The buffer supply voltage 220 (dvdd) may be, for example, 3.3 volts, 2.5 or 1.5 volts, or any other suitable supply voltage levels. A soft core supply voltage level 222, such as 1.8 volts or other suitable voltage level is also used in the output buffer 200.

The main buffer 206 includes a pair of cascaded pmos transistors 226 and a pair of nmos transistors 227 serially coupled as shown. The multi-supply voltage level shifting circuit 204 is coupled to an output buffer transistor 214 to facilitate multi-supply voltage level shifting in response to the use of one of the multiple supply voltages by providing a reference voltage high enough to provide normal operating voltage levels for the gate for pmos transistor 214. The single gate oxide devices shown all have the same gate oxide thickness, such as 30 angstroms or less. They are preferably FETs made of dioxide silicon but may be any suitable device or any suitable gate oxide.

The serially coupled single gate oxide cascaded pmos pair 226 includes pmos transistors 212 and 214. The nmos transistor pair 227 includes nmos transistors 230 and 232 coupled as shown. The gate of cascaded output buffer transistor 232 receives the input data signal 246. The other cascaded nmos transistor 230 has a gate operatively coupled to the soft core supply voltage 222. A gate of the pmos transistor 212 receives a buffer output drive signal 234 from a single gate oxide buffer drive circuit 236. A source is coupled to the supply voltage 220. The drain is also operatively coupled to the output buffer transistor 214.

The buffer 200 also includes a soft core supply and soft dvdd supply generator 240 which effectively serves to isolate the core supply voltage from the supply voltage used for the single gate oxide devices in the buffer circuit 200, to prevent ESD damage, as well as to bypass voltage supply noise. In addition, the soft buffer supply voltage circuit isolates the buffer supply voltage for single gate oxide devices located in the buffer 200. The prebuffer voltage level shifting circuit 205 also includes a single gate oxide cross-coupled active load 242 that is operatively coupled to the multi supply voltage level shifting circuit 204 and to the single gate oxide buffer drive circuit 236. The buffer drive circuit 236 serves primarily to provide additional current for the output buffer transistors 212 and 214 so that the output buffer can suitably drive loads connected to the I/O pad or pin.

The multi supply voltage level shifting circuit 204 receives a control signal 244 and a data signal 246. The control signal 244 may come from any suitable control logic. The input data signal 246 may come, for example, from core logic or other suitable data source. The multi supply voltage level shifting circuit 204 includes only single gate oxide devices that are operative to produce the variable prebuffer output signal 210 for the output buffer 206. The variable prebuffer output signal 210 is controlled to have a level within gate degradation levels of the signal gate oxide devices for the output buffer 206 and also for the multi supply voltage level shifting circuit. The variable prebuffer output signal is controlled to have a level within gate degradation levels for each of at least different first, second and third buffer supply voltages, such as 3.3 V, 2.5 V, and 1.5 V levels or any other suitable levels.

The multi supply voltage level shifting circuit 204 generates the variable prebuffer output signal 210 to be, in one embodiment, one of three different levels wherein each level is different depending upon which output buffer supply voltage is used. For example, irrespective of the logic level of the data 246, the multi supply voltage level shifting circuit 204 will output one of three different voltage levels to drive output cascaded pmos output transistor 214 and set the level for the buffer output drive signal 234. In one embodiment, where the buffer supply voltage (dvdd) is 1.5 V, the variable prebuffer output signal level may be 0 V. Where the buffer supply voltage is 2.5 V, for example, the variable prebuffer output signal will be controlled to approximately 1 V. Where the buffer supply voltage is 3.3 V, the variable prebuffer output signal 210 will be maintained at approximately 1.8 V.

The multi supply voltage level shifting circuit 204 also generates a first output signal 250 and a second output signal 252 where the first and second output signals are approximately inverse levels of one another. The signal gate oxide cross coupled active load 242 is operatively responsive to the first and second output signals 250 and 252. In this embodiment, the single gate oxide cross coupled active load 242 includes a pair of pmos transistors 256 and 258. A source of each of the pmos transistors 256 and 258 are operatively coupled to the buffer supply voltage 220. The transistor 256 has an input, such as its gate, operatively coupled to the first output signal 250. The first output signal 250 serves as buffer input drive signal to the buffer drive circuit 236. The pmos transistor 258 has its input operatively coupled to the second output voltage 252. In addition, the transistors 256 and 258 are cross coupled by having its respective gate coupled to the drain of the other device as shown. As such, the transistors 256 and 258 have their sources coupled to the buffer supply voltage 220. The gate of transistor 256 is coupled to the drain of transistor 258 and the gate of transistor 258 is cross coupled to the drain of transistor 256.

The single gate oxide buffer drive circuit 236 is operatively coupled to the output signal 250 and to a pair of cascaded output buffer transistors 226. The buffer drive circuit 236 includes a pmos transistor 260 and an nmos transistor 262. The buffer drive circuit 236 is configured as a type of inverter. As shown, the transistors 260 and 262 have their gates coupled to one another and their drains coupled to one another. The nmos transistor 262 has its source operatively coupled to receive the variable prebuffer output signal 210 and is also coupled to output buffer cascaded transistor 214. A drain of transistor 262 is operatively coupled to the gate of cascaded pmos transistor 212. The drain of transistor 260 is also operatively coupled to the gate of the output pmos transistor 212.

The single gate oxide cross coupled active load 242 includes cross coupling to provide feedback to reduce, for example, DC current consumption since only one active load such as transistor 256 or transistor 258 is "ON" at any time. The cross coupled active load serves to help pull up the buffer input drive signal 250 to a suitable level.

Figure 3:
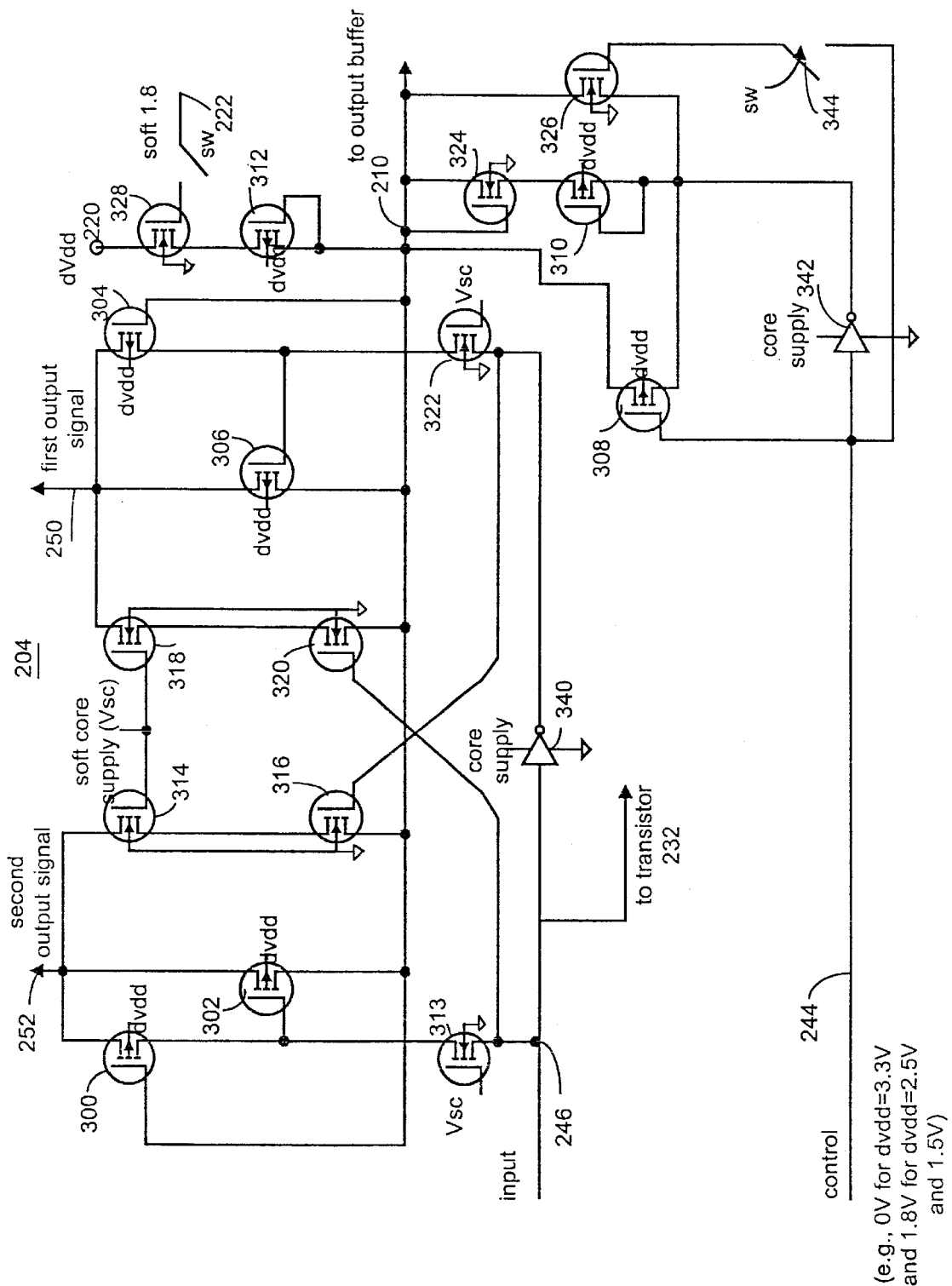
FIG. 3 is a schematic illustration of one embodiment of a single gate oxide voltage level shifting circuit in accordance with one embodiment of the invention.

FIG. 3 illustrates one example of a single gate oxide multi supply voltage level shifting circuit 204. In this embodiment, the circuit includes pmos transistors 300, 302, 304, 306, 308, 310 and 312. The circuit also includes nmos transistors 313, 314, 316, 318, 320, 322, 324, 326 and 328. The multi supply voltage level shifting circuit 204 also includes inverters 340 and 342 and switches 344 and 346.

For purposes of illustration, the below table will be used to describe the operation of the prebuffer voltage level shifting circuit 205, including the multi supply voltage level shifting circuit 204.

| Data | Output signal 250 | Dvdd | Variable prebuffer output signal 210 |
|---|---|---|---|
| 0 | 1.5 V | 1.5 V | 0 V |
| 0 | 2.5 V | 2.5 V | 1 V |
| 0 | 3.3 V | 3.3 V | 1.8 V |
| 1 | 0 V | 1.5 V | 0 V |
| 1 | 1 V | 2.5 V | 1 V |
| 1 | 1.8 V | 3.3 V | 1.8 V |

Additional core inverters may be used to provide noninverted output form the pad if it is necessary.

Referring to FIGS. 2 and 3, in operation, when the buffer supply voltage (dvd) is 1.5 V and the core supply voltage is 1.8 V, for example, the multi supply voltage level shifting circuit uses transistors 314, 316, 318 and 320 to provide the output signals 250 and 252 to the cross coupled active load 242. The multi supply voltage level shifting circuit 204 operates to output a 0 V level for the variable prebuffer output signal by allowing the control signal 244 to turn on transistor 326. In this mode, the switch 344 is closed and switch 222 connected to ground. Switch 344 may be any suitable logic which connects the control signal 244 to turn on the transistor 326. Switch 222 may be any suitable logic. As shown, the control signal 244 is passed through inverter 342. The control signal is set at approximately 1.8 V for dvdd=1.5 V and 2.5 V, for example. The other transistors are effectively disabled. With the input data level equal to zero, the output signal 250 is controlled with approximately 1.5 V. Output signal 252 is approximately 0 V, thereby turning on active load 258. As a result, the nmos transistor 262 and the drive circuit 236 is turned on to activate output buffer transistor 212. The voltage levels are such that the levels across the gate to drain and gate to source are within gate degradation levels for the single gate oxide devices of all the devices in the circuit 200.

When the buffer supply voltage is 2.5 V, transistors 300, 302, 314, 316, 318, 320, 306 and 304 are all operational to provide output signals 250 and 252 which change depending upon the level of the data input signal. The multi supply voltage level shifting circuit 204 operates to provide a variable prebuffer output signal of about 1 V equal to the threshold voltage drops of the nmos and pmos transistors 324 and 310. Again, as indicated for example in FIG. 3, the control signal is set about approximately 1.8 V thereby forcing the output of the inverter to be approximately 0 V. Transistors 328 and 312 serve to pull up the variable prebuffer output signal level to approximately 1 V. The switch 222 is closed allowing activation of the transistor 328. The switch 222 may be any suitable switch which provides a drive voltage to the transistor 328. Transistors 308 and 326 are effectively shut off. Therefore, transistors 328, 312 (configured as a diode), 324 and 310 set up a type of voltage divider. Again in this mode, the single gate oxide devices are operating within gate degradation levels for gate to drain and gate to source voltage potential levels.

The output signal 250 is variably controlled to be approximately 2.5 V when the data signal logic is zero, and 1.0 V when the data level is a logic 1. For the 2.5V DVDD voltage supply the level of variable prebuffer output signal is approximately 1V. Data signal logic level 0V would be sent to the gate of NMOS transistor 320 (to turn it "OFF") and through NMOS transistor 313 to the gate of PMOS transistor 302 (to turn it "ON"). Inverted data signal logic level 1.8V from inverter 340 will be sent to the gate of NMOS transistor 316 (to turn it "ON"). PMOS transistor 302 and NMOS transistor 316 (through NMOS transistor 314) will a send 1V variable prebuffer output signal to the gate of PMOS transistor 258 (to turn it "ON"). PMOS active load transistor 258 will provide a 2.5V level of output signal 250 to be sent to the input of buffer drive circuit 236, as well as to the gate of PMOS transistor 306 (through PMOS transistor 304) to open transistor 306 to provide nonconductive conditions for transistor 306. The 2.5V signal 250 couples to the gate of PMOS active load transistor 256 to turn it "OFF". As a result, the buffer drive circuit 236 will invert a 2.5V signal 250 to a 1V output signal to activate output buffer transistor 212 (output buffer transistor 214 is activated with a 1V variable prebuffer output signal). A data signal logic level 0V will effectively disable NMOS output buffer transistor 232. In that case, the potential of the I/O pad 202 will be 3.3V. The voltage levels are such that the levels across the gate to the drain and the gate to the source are within gate degradation levels for the single gate oxide devices of all devices in the circuit 200.

When the output buffer supply voltage is 3.3 V, for example, transistors 300, 302, 306 and 304 primarily provide the output control signals 250 and 252. The 1.8V voltage level of variable prebuffer output signal 210 is provided primarily by the operation of transistor 308. The control signal 244 is 0 V for the higher supply voltage level. The inverter 342 effectively shuts off the transistors 325, 310. The switches 344 and 222 are left open. An input data signal level of 0V will be sent to the gate of NMOS transistor 320 (to turn it "OFF") and through NMOS transistor 313 to the gate of PMOS transistor 302 (to turn it "ON"). The inverted input data signal of 1.8V from the output of inverter 340 will be sent to the gate of NMOS transistor 316 (to turn it "OFF"). Conductive PMOS transistor 302 will send a 1.8V variable prebuffer output signal to the gate of PMOS active load transistor 258 (to turn it "ON"). Conductive PMOS active load transistor 258 will provide 3.3V level of output signal 250 to be sent to the input of buffer drive circuit 236, as well as to provide 3.3V potential at the gate of PMOS transistor 306 (through conductive PMOS transistor 304) to disable PMOS transistor 306. A 3.3V signal 250 also goes to the gate of PMOS active load transistor 256 to turn it "OFF". As a result, the output drive circuit 236 will invert a 3.3V signal 250 to 1.8V output signal (in that case variable prebuffer output signal is 1.8V) to activate PMOS output buffer transistor 234. PMOS output buffer transistor 214 is activated with a 1.8V variable prebuffer output signal. A 0V input data signal will disable NMOS output buffer transistor 232, so the potential of the I/O pad will be 3.3V.

In the case of 1.8V data input signal, PMOS active load transistor 256 will conduct to effectively turn "OFF" PMOS active load transistor 258. In that case, the second output signal 252 will be 3.3V and the first output signal 250 will be 1.8V. The buffer drive circuit 236 will invert the 1.8V signal to the level of 3.3V to effectively disable PMOS output buffer transistor 234. In that case, a 1.8V input data signal will provide conductive conditions for NMOS output buffer transistor 232 (NMOS output buffer transistor 230 is in a conductive mode because of 1.8V soft core supply voltage potential at the gate of transistor 230) and the potential of the I/O pad will be 0V. The voltage levels are such that the levels across the gate to the drain and the gate to the source are within gate degradation levels for the single gate oxide devices of all devices in the circuit 200.

Referring to FIGS. 4a and 4b, an example of a core supply isolation circuit 400 and an example of a output buffer supply voltage isolation circuit 402 is shown. These isolation circuits form the soft supply and soft dvdd supply generator 240. The core supply isolation circuit receives a core supply voltage 404 or other suitable supply voltage and outputs an isolated supply voltage, such as a soft core supply voltage 222. In this embodiment, a pmos transistor 406, nmos transistor 408 and nmos transistor 410 are used. Transistor 406 serves as part of the isolation circuit, transistors 408 needs to provide low potential at the gate of PMOS transistor 406 during power up procedure, transistor 410 serve as a feedback path to provide active 0V potential at the gate of PMOS transistor 406 during normal job operation to eliminate any noise and cross-coupling issues. In addition, supply isolation circuit provides big input capacitive load for the core voltage supply to bypass noise from the core voltage supply.

The soft buffer supply voltage supply generator 402 receives the buffer supply voltage which may be one of a plurality of different supply voltages 412 and to send output soft supply voltage 220. The isolation circuit 402 in this example, uses pmos transistor 414 and nmos transistors 416 and 418. The operation of these transistors are similar to the transistors 406, 408 and 410. Transistor 414 serves to isolate the buffer supply voltage (to prevent ESD damage to the main circuits and to bypass noise), NMOS transistor 418 serves to provide enough potential at the gate of PMOS transistor 414 to turn it "ON" during power up procedure, NMOS transistor 416 serves as a feedback path to provide core voltage supply level at the gate of PMOS transistor 414. In addition the circuit provides a large capacitive load for the buffer voltage supply to bypass noise from the buffer voltage supply. The voltage levels are such that the levels across the gate to the drain and the gate to the source are within gate degradation levels for the single gate oxide devices of all devices in the circuit 200.

The aforedescribed multi supply voltage level shifting circuit includes therefore a variable prebuffer output signal generating circuit having at least three separate voltage control circuits, each configured to generate a different voltage level (a variable prebuffer output signal) in response to the control signal and the level of the buffer supply voltage. For example, the transistor 326 provides variable prebuffer voltage signal level of approximately 0 V when dvdd is 1.5 V. Also, for example, transistors 328, 312, 324 and 310 provide a different variable prebuffer voltage signal level of approximately 1V when a different supply voltage is used, such as 2.5 V. In addition, transistor 308 provides approximately 1.8 V as the variable prebuffer output signal when yet a different supply voltage (such as 3.3V) is used. It will be recognized that the circuits shown in FIGS. 2 and 3 are examples only, and that any suitable configurations may be used to provide separate voltage levels for each of different output supply voltages. Moreover, it will be recognized that any suitable cross coupled active load may also be used. In addition, depending upon the required current, the drive circuit 236 may not be necessary.

It should be understood that the implementation of other variations and modifications of the invention in its various aspects will be apparent to those of ordinary skill in the art, and that the invention is not limited by the specific embodiments described. For example, it will be recognized that another suitable transistor types or configurations may also be used, if desired. It is therefore contemplated to cover by the present invention, any and all modifications, variations, or equivalents that fall within the spirit and scope of the basic underlying principles disclosed and claimed herein.

What is claimed is:

1. A pre-buffer voltage level shifting circuit operative with an output buffer that alternately uses one of a plurality of different supply voltages as a buffer supply voltage comprising:

a multi-supply voltage level shifting circuit, operatively responsive to a control signal and a data signal, including signal gate oxide devices operative to produce a variable pre-buffer output signal for the output buffer wherein the variable prebuffer output signal is controlled to have a level within gate degradation levels of the single gate oxide devices for each of different at least first, second and third buffer supply voltages, and wherein the multi-supply voltage level shifting circuit generates a first output signal and a second output signal; and a first circuit configured as a signal gate oxide cross coupled active load for the multi-supply voltage level shifting circuit operatively responsive to the first and second output signals and operatively coupled to the buffer supply voltage.

2. The circuit of claim 1 including a second circuit configured as a single gate oxide buffer drive circuit operatively coupled to the second output signal and to at least a pair of cascaded output buffer transistors operative to drive the cascaded output buffer transistors.

3. The pre-buffer voltage level shifting circuit of claim 1 wherein the first circuit includes a first transistor, operatively coupled to the buffer supply voltage and having an input operatively coupled to the first output signal, and a second transistor operatively coupled to the buffer supply voltage and having an input operatively coupled to the second output voltage.

4. The pre-buffer voltage level shifting circuit of claim 3 wherein the first and second transistors are pmos transistors and wherein a source of each of the first and second transistors is operatively coupled to the buffer supply voltage and wherein the gate of the first transistor is cross coupled to the drain of the second transistor and wherein the gate of the second transistor is operatively cross coupled to the drain of the first transistor.

5. The pre-buffer voltage level shifting circuit of claim 2 wherein the second circuit includes a third transistor having an input operatively coupled to the second output signal and to an input of a fourth transistor and source operatively coupled to the buffer supply voltage and a drain operatively coupled to a gate of one of a cascaded output buffer transistor, and wherein the fourth transistor has a source operatively coupled to the drain of the third transistor and has a drain operatively coupled to receive the variable pre-buffer output signal.

6. The pre-buffer voltage level shifting circuit of claim 1 wherein the multi-supply voltage level shifting circuit includes:
- a first output signal generator circuit having at least a first transistor with an input operatively coupled to receive the variable pre-buffer output signal, and a second transistor operatively coupled to receive an inverted data signal;
- a second output signal generator circuit having at least a third transistor with an input operatively coupled to receive the variable pre-buffer output signal, and a second transistor operatively coupled to receive the data signal; and
- variable pre-buffer output signal generating circuit having at least three separate voltage control circuits each configured to generate a different voltage level of the variable pre-buffer output signal in response to the control signal and the level of buffer supply voltage.

7. The pre-buffer voltage level shifting circuit of claim 1 wherein the multi-supply voltage level shifting circuit is capable of generating a variable pre-buffer output signal having at least three different voltage levels corresponding to each of the first second and third buffer supply voltages.

8. The pre-buffer voltage level shifting circuit of claim 1 including a first switch and a second switch wherein the first switch is operatively responsive to switch at least one transistor to provide the variable prebuffer output voltage at a first level corresponding to a first output buffer supply level, and wherein the second switch is operatively responsive to switch a pull up circuit to provide the variable prebuffer output voltage at a second level corresponding to a second output buffer supply level.

9. A pre-buffer voltage level shifting circuit operative with an output buffer that alternately uses one of a plurality of different supply voltages as a buffer supply voltage comprising:
- a multi-supply voltage level shifting circuit, operatively responsive to a control signal and a data signal, including single gate oxide devices operative to produce a variable pre-buffer output signal for the output buffer wherein the variable prebuffer output signal is controlled to have a level within gate degradation levels of the single gate oxide devices for each of different at least first, second and third buffer supply voltages, and wherein the multi-supply voltage level shifting circuit generates a first output signal and a second output signal and wherein the multi-supply voltage level shifting circuit generates a variable pre-buffer output signal having at least three different voltage levels corresponding to each of first second and third buffer supply voltages;
- a first circuit configured as a single gate oxide cross coupled active load for the multi-supply voltage level shifting circuit operatively responsive to the first and second output signals and operatively coupled to the buffer supply voltage; and
- a second circuit configured as a single gate oxide buffer drive circuit operatively coupled to the second output signal and to at least a pair of cascaded output buffer transistors operative to drive the cascaded output buffer transistors.

10. The pre-buffer voltage level shifting circuit of claim 9 wherein the first circuit includes a first transistor, operatively coupled to the buffer supply voltage and having an input operatively coupled to the first output signal, and a second transistor operatively coupled to the buffer supply voltage and having an input operatively coupled to the second output voltage.

11. The pre-buffer voltage level shifting circuit of claim 10 wherein the first and second transistors are pmos transistors and wherein a source of each of the first and second transistors is operatively coupled to the buffer supply voltage and wherein the gate of the first transistor is cross coupled to the drain of the second transistor and wherein the gate of the second transistor is operatively cross coupled to the drain of the first transistor.

12. The pre-buffer voltage level shifting circuit of claim 9 wherein the second circuit includes a third transistor having an input operatively coupled to the second output signal and to an input of a fourth transistor and source operatively coupled to the buffer supply voltage and a drain operatively coupled to a gate of one of a cascaded output buffer transistor, and wherein the fourth transistor has a source operatively coupled to the drain of the third transistor and has a drain operatively coupled to receive the variable pre-buffer output signal.

13. The pre-buffer voltage level shifting circuit of claim 9 wherein the multi-supply voltage level shifting circuit includes:
- a first output signal generator circuit having at least a first transistor with an input operatively coupled to receive the variable pre-buffer output signal, and a second transistor operatively coupled to receive an inverted data signal;
- a second output signal generator circuit having at least a third transistor with an input operatively coupled to receive the variable pre-buffer output signal, and a second transistor operatively coupled to receive the data signal; and
- variable pre-buffer output signal generating circuit having at least three separate voltage control circuits each configured to generate a different voltage level of the variable pre-buffer output signal in response to the control signal and the level of buffer supply voltage.

14. The pre-buffer voltage level shifting circuit of claim 9 including a first switch and a second switch wherein the first switch is operatively responsive to switch at least one transistor to provide the variable prebuffer output voltage at a first level corresponding to a first output buffer supply level, and wherein the second switch is operatively responsive to switch a pull up circuit to provide the variable prebuffer output voltage at a second level corresponding to a second output buffer supply level.

* * * * *